(12) United States Patent
Jones

(10) Patent No.: US 6,437,657 B1
(45) Date of Patent: Aug. 20, 2002

(54) DIFFERENTIAL CONVERSION CIRCUIT WITH A LARGER COUPLING CAPACITOR THAN RESONATOR CAPACITOR

(75) Inventor: Mark Alan Jones, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 10 days.

(21) Appl. No.: 09/668,963

(22) Filed: Sep. 25, 2000

(51) Int. Cl.[7] .............................................. H03H 7/42
(52) U.S. Cl. ........................................... 333/25; 333/32
(58) Field of Search .................................... 333/25, 32

(56) References Cited

U.S. PATENT DOCUMENTS 5,886,591 A * 3/1999 Jean et al. ..................... 333/25

* cited by examiner

Primary Examiner—Justin P. Bettendorf
Assistant Examiner—Damian E. Cathey
(74) Attorney, Agent, or Firm—Wildman Harrold Allen & Dixon

(57) ABSTRACT

A differential conversion circuit for converting an unbalanced signal to a balanced signal is provided. The differential conversion circuit is arranged with primarily passive components, and so avoids introducing noise or other disturbances to the signal. The differential conversion circuit has a terminal input for receiving an unbalanced signal that is related to a communication input signal. An inductor and a resonating capacitor connect to the terminal input, and a coupling capacitor connects to the inductor. One differential output line is provided by the resonating capacitor, while the other differential output line is provided by the coupling capacitor. The output from the capacitors is thereby a pair of lines that provide a balanced differential signal which is deliverable to a balanced load.

10 Claims, 4 Drawing Sheets

DIFFERENTIAL CONVERSION CIRCUIT WITH A LARGER COUPLING CAPACITOR THAN RESONATOR CAPACITOR

FIELD OF THE INVENTION

The field of the present invention is electronic circuits. More particularly, the present invention relates to an electronic configuration for use in a radio frequency device.

BACKGROUND OF THE INVENTION

Wireless devices are transforming how people work, relax, and communicate. These devices can enable convenient access to informational, educational, and entertainment data, and provide a convenient portal for worldwide communication. Some of the most popular wireless devices are portable, which benefit not only from a small footprint, but also require a consistent and robust communication link to be useful. Without the benefit of such a dependable communication link, users are unable to reasonably rely on the availability of their wireless devices.

Generally, a wireless device has a radio transceiver that communicates with other mobile devices or to a more permanent base station. Accordingly, the wireless device has an antenna that is used to both transmit and receive radio frequency signals. In particular, the antenna and wireless device are typically configured to operate on a particular range of radio frequencies, with an information signal modulated on the radio wave.

It is a particularly difficult problem to configure a wireless device to reliably and robustly receive signals in a manner that enables the information signal to be consistently demodulated and used. Several factors affect the quality of reception and the usability of the information signal. For example, the modulation signal may be subjected to physical interferences, such as buildings, that substantially attenuate the modulation signal. Further, distance from the modulation signal source also substantially attenuate the modulation signal.

The wireless device typically has an antenna that electrically couples to processing circuitry using a single-ended connection. A single ended connection is also known as an unbalanced connection. Such a single-ended, unbalanced connection provides a ground connector and a signal connector, with the signal connector transmitting all the signal information. However, such a single ended, or unbalanced, signal tends to be highly susceptible to noise, such as power supply ripple or crosstalk from other circuitry. Inducing such noise in a wireless device results in a lower signal to noise ratio, and increases the risk of losing the information signal. It is therefore desirable to use balanced signals and connections in a wireless device. However, although balanced antennas outputting balanced signals are known, the balanced antennas are generally larger than unbalanced antennas and therefore add an undesirable bulk and weight to wireless devices. Accordingly, it has not been practical to use balanced antennas on wireless devices.

Practical limitations therefore suggest the use of the single-ended antennae on wireless devices. However, it is also known that wireless devices would benefit from the use of balanced signals, as balanced signals are less susceptible to noise, for example. Accordingly, known conventional wireless devices have processing circuitry for converting the unbalanced signal to a balanced signal. In such a manner, the singled-ended antennae signal is converted to a balanced signal to enhance the efficiency and reduce susceptibility to noise.

In known wireless devices, single-ended signals are typically converted to a balanced signal using a device commonly referred to as a "balun" transformer. A balun, which is an abbreviation for "balanced-unbalanced", may be arranged, for example, as a balancing transformer. The balun receives the single-ended signal and outputs a balanced signal, such as a differential signal. In the differential signal, the output signal is a function of the difference between two conductors, and is therefore less susceptible to noise or other disturbances.

Although the use of a balun in a wireless device advantageously provides balanced signals for processing, the balun is often bulky since it is not easily implemented inside on integrated circuit. The nature of the known balun device causes the balun to undesirably add size and cost to the wireless device. The balun may also cause a signal loss, which may translate into a degraded noise figure and lower performance characteristics for the wireless device.

SUMMARY OF THE INVENTION

It is therefore an object of the present invention to provide a circuit for converting an unbalanced signal to a balanced signal without the disadvantages associated with using a balun transformer.

Briefly, the present invention provides a differential conversion circuit for converting an unbalanced signal to a balanced signal. The differential conversion circuit is constructed with primarily passive components which may be arranged on an integrated circuit to minimize size and cost. The differential conversion circuit has a terminal input for receiving an unbalanced signal that is related to a communication input signal. An inductor and a resonating capacitor connect to the terminal input, and a coupling capacitor connects to the inductor. One differential output line is provided by the resonating capacitor, while the other differential output line is provided by the coupling capacitor. The output from the capacitors is thereby a pair of lines that provide a balanced differential signal which is deliverable to a balanced load.

Advantageously, the differential conversion circuit uses primarily passive components, and so does not introduce noise or other disturbances due to the use of active components. Additionally, the differential conversion circuit is constructed from only a few components, and so adds little cost to manufacturing a wireless device. Further, the differential conversion circuit is compact and easily integrated into new or existing radio frequency (rf) circuit designs.

These and other features and advantages of the present invention will be appreciated from review of the following detailed description of the invention, along with the accompanying figures in which like reference numerals refer to like parts throughout.

DETAILED DESCRIPTION OF THE INVENTION

Figure 1:
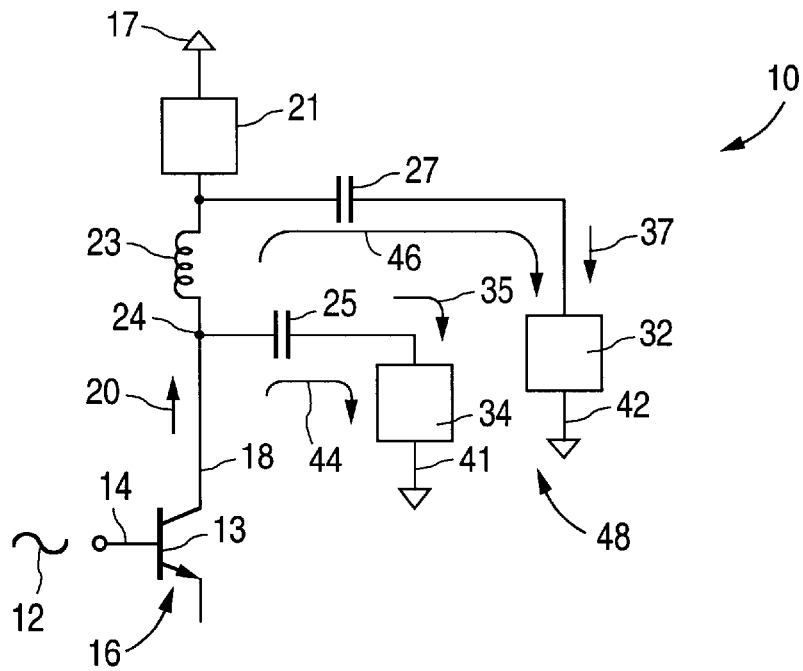
FIG. 1 is a general schematic layout for a differential conversion circuit in accordance with the present invention.

In accordance with the present invention, a differential conversion circuit 10 is shown in FIG. 1. The differential conversion circuit 10 is arranged for use in a wireless device, and in particular, a wireless device operating in a radio frequency band. However, it will be appreciated that the differential conversion circuit 10 may be modified for use in other devices and at other frequencies. For example, the differential conversion circuit 10 may be used in cable television receivers, satellite transceivers, cordless phones, or other devices where a conversion from an unbalanced signal to a balanced signal is desirable.

The differential conversion circuit 10 receives an input RF current 20 at terminal point 24. The input RF current 20 may be provided by, for example, by transistor 16. In the described example, transistor 16 receives an RF signal 12 at its base, and generates the input RF current 20 from its collector 13. The RF signal 12, and the RF current 20 are both single ended, i.e., unbalanced, signals. It will be appreciated that the input RF current 20 may be generated in alternative ways.

From the terminal point 24, two electrical paths 44, 46 are provided. Each of the electrical paths 44, 46 provides one line of a differential output 48. The first electrical path 44 extends from the terminal point 24, through resonating capacitor 25 and load 34, and results in one line 41 of the differential output 48. The second electrical path 46 extends from the terminal point 24, through inductor 23, coupling capacitor 27, and load 32, and results in the other line 42 of the differential output 48.

A collector voltage source 17 is provided to an isolation load 21, which is connected to both the coupling capacitor 27 and the inductor 23. The isolation load 21 is selected to provide a high impedance at the frequency of the RF signal, but to pass a DC current. Accordingly, the collector voltage source 17 is enabled to provide a collector voltage for transistor 16.

The inductor 23 and the resonating capacitor 25 are selected to resonate at the frequency of the input RF signal 12. More particularly, the inductor 23 and the resonating capacitor 25 are sized according to the well known equation:

RF=1/(2πSqrt(L×C))

where,

RF is the frequency of the input signal 12;

L is the inductance value of the inductor 23; and

C is the capacitance value of the capacitor 25.

The value of the capacitor 27 is selected such that capacitor 27 acts as a coupling capacitor at the frequency of the RF input signal 12.

Loads 34 and 32 are balanced low impedance loads. Load 34 receives differential current phase 35, and load 32 receives differential current phase 37. The gain of the differential conversion circuit 10 is thereby determined by comparing the differential current phases 35 and 37 with the input RF current 20. More particularly the gain is calculated with the formula:

$$\text{Current Gain} = |(I_{37} - I_{35})/(I_{20})| = \frac{WL}{R} = \frac{1}{WCR},$$

where,

R is resistance of loads 34, 32;

W=2 $f_o$, where $f_o$ is operating frequency;

L=value of inductor 23;

C=value of capacitor 25;

$I_{37}$ is the current 37 through load 32;

$I_{35}$ is the current 35 through load 34; and $I_{20}$ is the RF input current 20.

In operation, the differential conversion circuit 10 has been found to provide a substantial current gain, as defined above, without introducing noise due to the use of active components. Since the differential conversion circuit 10 is also implemented with only a few passive components, the differential conversion circuit 10 is easily and economically added to electronic designs.

Figure 2:
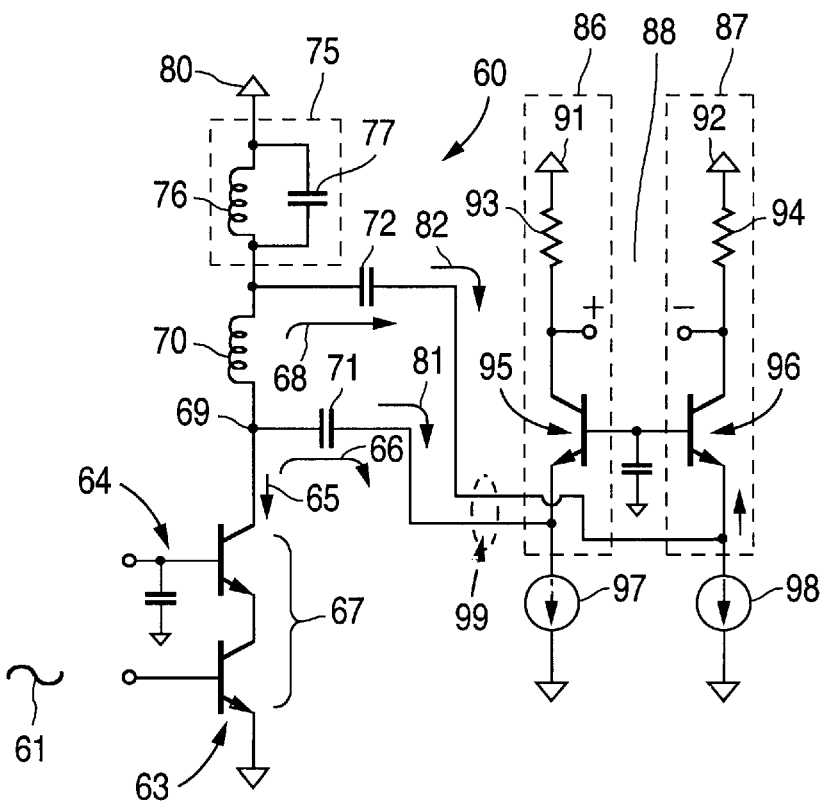
FIG. 2 is a schematic diagram of an embodiment of a differential conversion circuit in accordance with the present invention.

Referring now to FIG. 2, another differential conversion circuit 60 is shown. The differential conversion circuit 60 receives an RF input current 65 from cascode transistors 67. More particularly, an RF input signal 61 is provided to transistor 63, which cooperates with transistor 64 to provide the RF input current 65.

The RF input current 65 is received at terminal point 69 of the differential conversion circuit 60. From the terminal point 24, two electrical paths 66, 68 are provided. Each of the electrical paths 66, 68 provides one phase of a differential current output 99. The first electrical path 66 extends from the terminal point 69, through resonating capacitor 71 and load 86, and provides a current 81. The second electrical path 68 extends from the terminal point 69, through inductor 70, coupling capacitor 72 and load 87, and provides a current 82. Accordingly, the differential conversion circuit 60 is used to convert the single ended RF input signal 61 to the differential current output 99.

A collector voltage source 80 is provided to an isolation load 75, which is connected between the coupling capacitor 72 and the inductor 70. The isolation load is a parallel LC circuit having inductor 76 and capacitor 77. Inductor 76 and capacitor 77 are selected to resonate at the frequency of the RF signal input 61.

The inductor 70 and the resonating capacitor 71 are also selected to resonate at the frequency of the input RF signal 61, while the value of the capacitor 72 is selected such that capacitor 72 acts as a coupling capacitor at the frequency of the RF input signal 61.

Loads 86 and 87 are balanced low impedance loads, due to their configuration as a differential common base amplifier. In FIG. 2, loads 86 and 87 are arranged to receive differential current phases 81 and 82, respectively. Load 86 has a dc current 97 for biasing transistor 95, which receives differential current phase 81 at its emitter. Power supply voltage 91 couples to the collector of transistor 95, which provides one pole for the voltage output 88. In a similar manner, load 87 has a dc current 98 for biasing transistor 96, which receives differential current phase 82 at its emitter. Power supply voltage 92 couples to the collector of transistor 96, which provides the opposing pole for the voltage output 88. Accordingly, a balanced differential signal is provided at output 88 in response to the unbalanced, i.e., single-ended, input signal 61.

Figure 3:
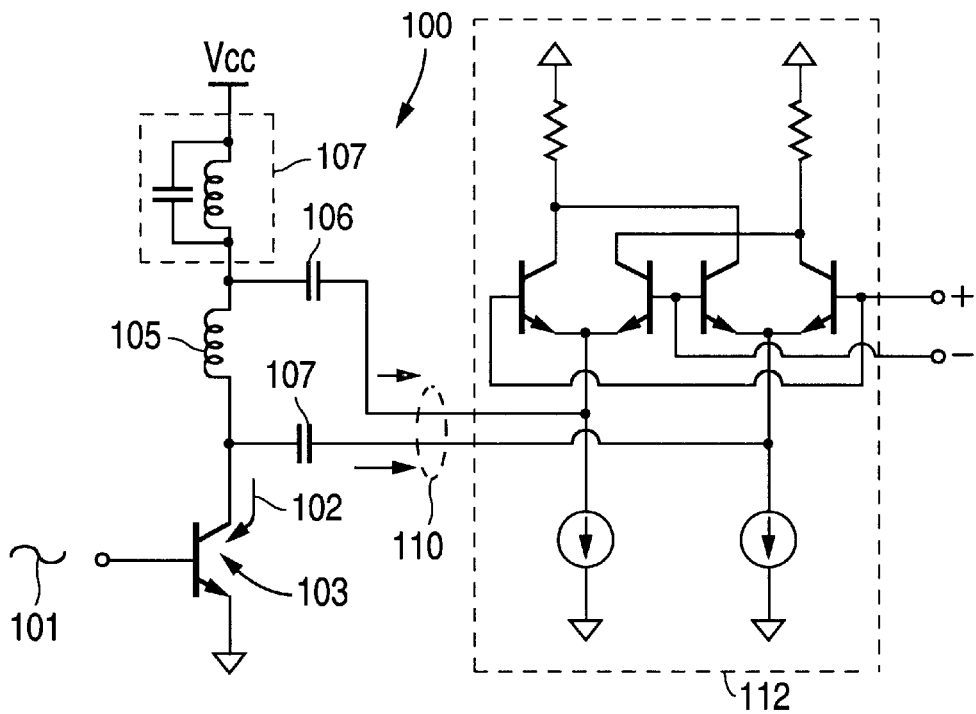
FIG. 3 is a schematic diagram of another embodiment of a differential conversion circuit in accordance with the present invention.

FIG. 3 shows another circuit having a differential conversion circuit 100. As the differential conversion circuit 100 is similar to differential conversion circuits 10 and 60 described above, differential conversion circuit 100 will only be generally described.

An RF signal 101 is received by transistor 103, which provides an RF input current 102 for the differential conversion circuit 100. Using inductor 105, resonating capacitor 107, coupling capacitor 106, and isolation load 107, the differential conversion circuit 100 converts the single-ended RF input current 102 into differential current output 110. In FIG. 3, the differential current output 110 is received into a Gilbert mixer quad 112, which provides a balanced load for each current phase of differential current output 110.

Figure 4:
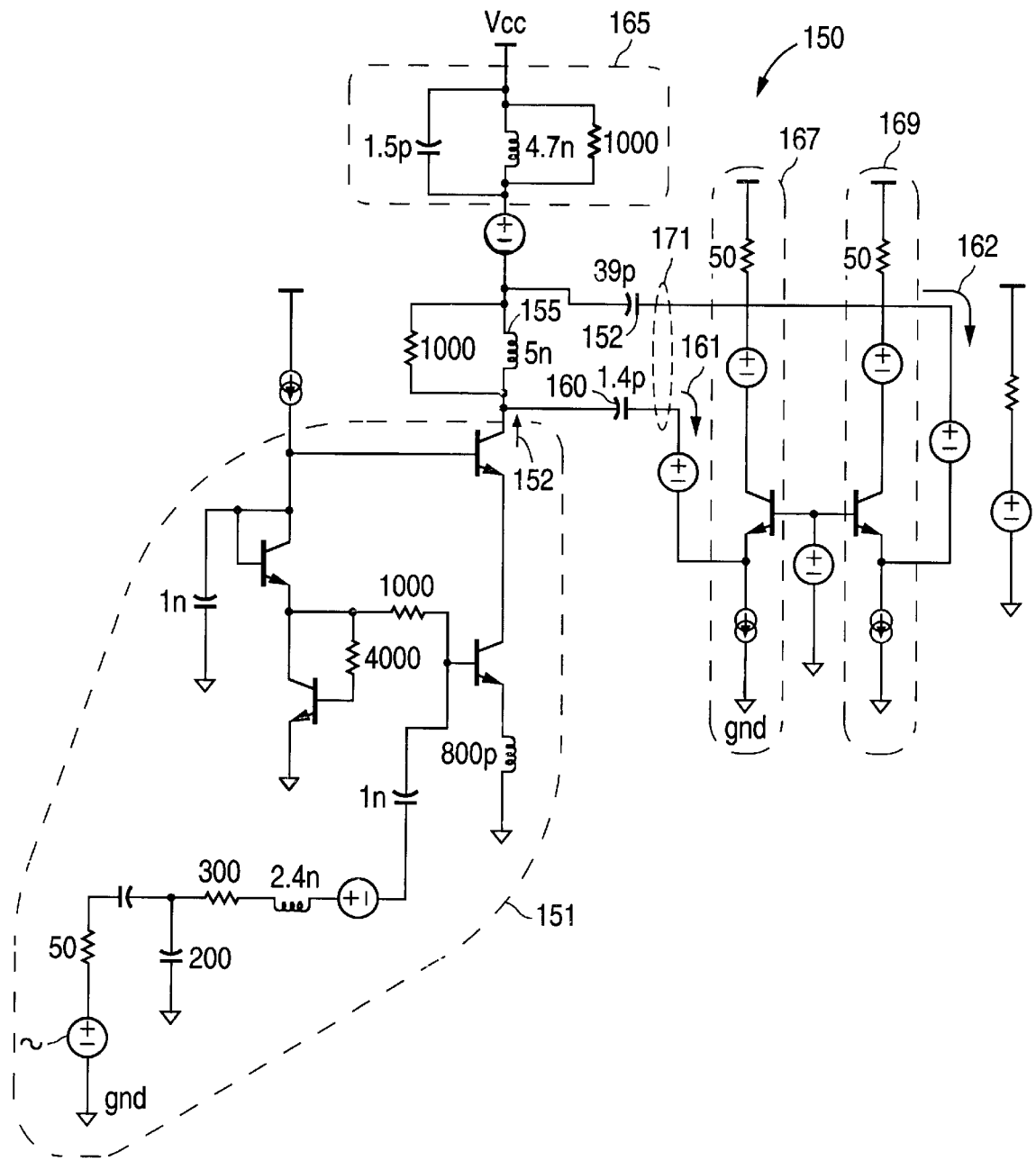
FIG. 4 is a detailed schematic diagram of an embodiment of a differential conversion circuit in accordance with the present invention.

Referring now to FIG. 4, a specific circuit incorporating a differential conversion circuit 150 is shown. As the differential conversion circuit 150 is similar to differential conversion circuits 10, 60, and 100, described above, differential conversion circuit 150 will only be generally described. Differential conversion circuit 150 receives an RF input current 152 from an RF signal source 151. The RF signal source 151 provides an RF input signal of about 1.9 GHz. Although FIG. 4 uses a specific signal source 151 for providing the RF signal current 152, it will be understood that other circuits can be substituted that provide other frequencies and currents.

The differential conversion circuit 150 converts the RF input current 152 into a balanced differential current output 171. The balanced differential current output 171 comprises differential current phase 161, which is received into load 167, and differential current phase 162, which is received into load 169.

In FIG. 4, inductor 155 and resonating capacitor 160 are selected to resonate at the frequency of the RF input signal, which is about 1.9 GHz. Accordingly, the inductor 155 is selected to be 5 nH, and the resonating capacitor 160 is selected to be 1.4 pF. The coupling capacitor 157 is selected to be substantially larger than the resonating capacitor 160, and so is selected to be at 39 pF. In a similar manner the inductor and capacitor of the isolation load 165 are selected to resonate near 1.9 GHz. Although FIG. 4 discloses particular values for the capacitors and inductor, it will be appreciated that the selected values may be adjusted according to the manner described herein. It will also be appreciated that different loads 167 and 169 may be substituted, as well as different technologies used to implement the circuit. Preferably the differential conversion circuit is implemented as an integral section of an integrated circuit package, but it will be appreciated that the differential conversion circuit may be implement using surface mount or other discrete components.

Figure 5:
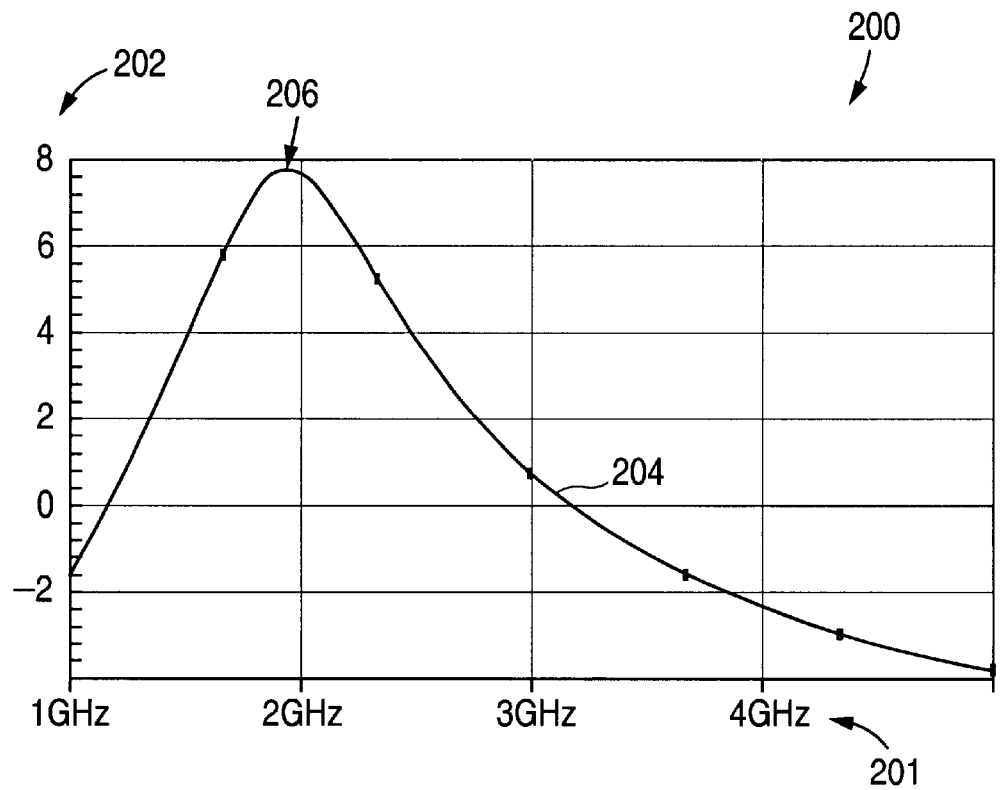
FIG. 5 is a current gain chart showing a simulation result using the circuit of FIG. 4.
Figure 6:
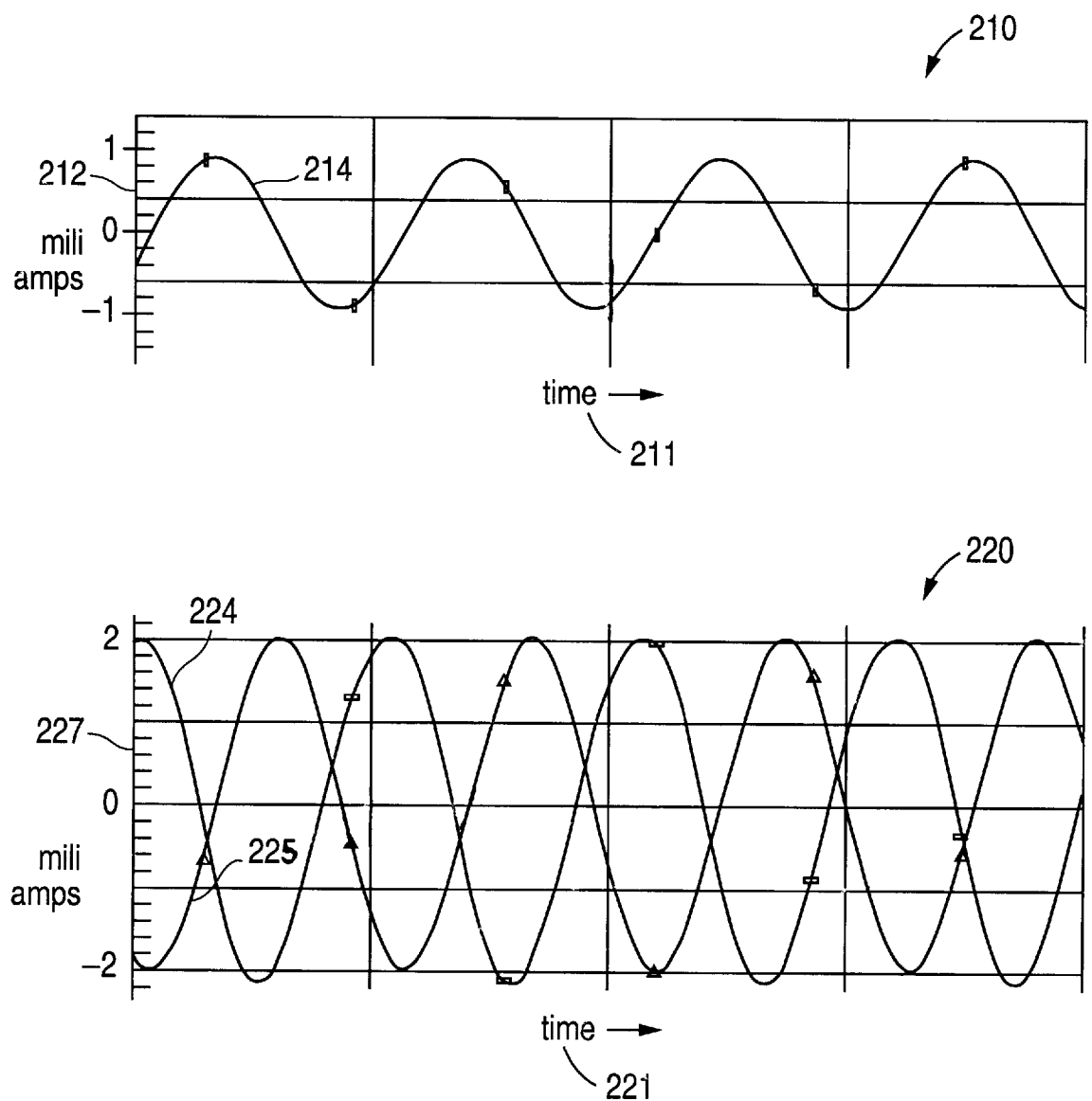
FIG. 6 contains current charts showing a simulation result using the circuit of FIG. 4.

The circuit shown in FIG. 4 was used in an electric circuit simulation program with the results of the simulation shown in FIGS. 5 and 6. FIG. 5 shows a current gain chart 200 with the x-axis 201 representing input frequency in gigaHertz, and the y-axis 202 representing a numerical gain factor. As can be seen from result line 204, the current gain peak 206 occurs near the input frequency of about 1.9 GHz.

FIG. 6 has an input current chart 210 and an output current chart 220. Each chart 210 and 220 has time represented on the x-axis 211, 221, and current in miliamps represented on the y-axis 217, 227. As can be seen from the charts, the input current 214 cycles between about 1 mA, while each of the differential output currents 224, 225 cycle between about 2 mA.

Advantageously, the differential conversion circuit provides an efficient conversion from an unbalanced signal to a balanced signal without introducing substantial noise associated with active components. Accordingly, the differential conversion circuit may be incorporated into a wide range of telecommunication and other devices where a low-noise conversion is desirable.

One skilled in the art will appreciate that the present invention can be practiced by other than the preferred embodiments which are presented in this description for purposes of illustration and not of limitation, and the present invention is limited only by the claims which follow. It is noted that equivalents for the particular embodiments discussed in this description may practice the invention as well.

What is claimed is:

1. A differential conversion circuit, comprising:

an input terminal for conveying an unbalanced signal at an input frequency;

an inductor and a resonating capacitor connected to the input terminal, the inductor and resonating capacitor selected to resonate substantially at the input frequency;

a coupling capacitor serially connected to the inductor, the coupling capacitor selected to provide signal coupling substantially at the input frequency wherein said coupling capacitor is substantially higher in capacitance that said resonating capacitor;

a first differential output connected to the resonating capacitor; and a second differential output connected to the coupling capacitor.

2. The circuit according to claim 1, wherein the input frequency is an RF frequency.

3. The circuit according to claim 1, wherein the unbalanced signal is provided as a radio frequency current.

4. The circuit according to claim 1, further including an isolation load connected to the inductor and the coupling capacitor.

5. The circuit according to claim 4, wherein the isolation load is further connected to a voltage source.

6. The circuit according to claim 4, wherein the isolation load is a high impedance load substantially at the input frequency and can pass a DC current.

7. The circuit according to claim 1, wherein the input terminal is connected to a transistor for receiving the unbalanced signal.

8. The circuit according to claim 1, wherein the input terminal is configured to convey the unbalanced signal as an input current.

9. The circuit according to claim 1, wherein the first differential output is connected to a first load, and the second differential output is connected to a second load, the first load and the second load being arranged to provide a low impedance balanced load.

10. The circuit according to claim 1 arranged to provide a signal gain as measured from the input terminal to the first and second differential outputs.

* * * * *